(12) United States Patent
Blackburn et al.

(10) Patent No.: US 7,948,151 B1
(45) Date of Patent: May 24, 2011

(54) ELECTROACTIVE POLYMER-BASED ARTIFICIAL NEUROMUSCULAR UNIT

(75) Inventors: Michael R. Blackburn, Encinitas, CA (US); Wayne C. McGinnis, San Diego, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 209 days.

(21) Appl. No.: 12/421,467

(22) Filed: Apr. 9, 2009

(51) Int. Cl.
*H01L 41/04* (2006.01)
*H02N 2/04* (2006.01)

(52) U.S. Cl. .......... 310/328; 310/330; 310/800

(58) Field of Classification Search .......... 310/328, 310/330–332, 800
See application file for complete search history.

(56) References Cited

U.S. PATENT DOCUMENTS

| | | | |
|---|---|---|---|
| 6,157,113 A | 12/2000 | Hunter et al. | |
| 6,249,076 B1 | 6/2001 | Madden et al. | |
| 6,574,958 B1 | 6/2003 | MacGregor | |
| 6,806,511 B2 | 10/2004 | Armgarth et al. | |
| 6,833,656 B2 | 12/2004 | Hooley et al. | |
| 6,936,955 B1 | 8/2005 | Smela et al. | |
| 7,193,350 B1 | 3/2007 | Blackburn et al. | |
| 2008/0303782 A1* | 12/2008 | Grant et al. | 345/156 |
| 2010/0109595 A1* | 5/2010 | Tan et al. | 318/652 |

OTHER PUBLICATIONS

Federico Carpi and Danilo De Rossi, Electroactive Polymer-Based Devices for e-Textiles in Biomedicine, IEEE Transactions on Information Technology in Biomedicine, vol. 9, No. 3, Sep. 2005, 295.
Miaoxiang Chen, Printed Electrochemical devices using conducting polymers as active materials on flexible substrates, Proceedings of the IEEE, vol. 33, No. 7, Jul. 2005, 1339-1347.
Zheng Chen et al., Integrated Sensing for Ionic Polymer-Metal Composit Actuators Using PVDF Thin Films, Smart Materials and Structures, vol. 16, 2007, S262-S271.
Evan Malone and Hod Lipson, Freeform Fabrication of Electroactive Polymer Actuators and Electromechanical Devices, available at http://ccsl.mae.cornell.edu/papers/SFF04__Malone.pdf, believed to have been first posted on Feb. 6, 2006.
L.A. Momoda, The Future of Engineering Materials: Multifunction for Performance Tailored Structures, HRL Laboratories, available at http://www.nae.edu/nae/naefoe.nsf/weblinks/JHAY-65GJNW/$FILE/Momoda.pdf, Sep. 2005.
Peter G. Madden, John D. Madden, Patrick A. Anquetil, Hsiao -Hua Yu, Timothy M. Swager, and Ian W. Hunter, Conducting Polymers as Building Blocks for Biomimetic Systems, 2001 UUST Bio-Robotics Symposium, The University of New Hampshire, Aug. 27-29, 2001.
John D. Madden, Ryan A. Cush, Tanya S. Kanigan, Colin J. Brenan, Ian W. Hunter, Encapsulated Polypyrrole Actuators, Synthetic Metals 105__1999.61-64.
Ali Izadi-N Ajafabadi, Dawn Th Tan and John D. Madden, Towards High Power Polypyrrole/Carbon Capacitors, Synthetic Metals, 152, 129-132, Part 1 Special Issue, 2005.

* cited by examiner

*Primary Examiner* — Derek J Rosenau
(74) *Attorney, Agent, or Firm* — Kyle Eppele; J. Eric Anderson

(57) ABSTRACT

An artificial neuromuscular unit (ANMU) comprising: an electroactive polymer (EAP) actuator layer; an EAP logic layer coupled to the actuator layer; an EAP energy layer coupled to the logic layer such that the logic layer is interposed between the energy layer and the actuator layer, wherein the logic layer is configured to control energy transfer between the energy layer and the actuator layer; and a sensor element operatively coupled to the actuator layer and the logic layer, wherein the sensor element is configured to communicate deflections of the actuator layer to the logic layer.

18 Claims, 6 Drawing Sheets

ELECTROACTIVE POLYMER-BASED ARTIFICIAL NEUROMUSCULAR UNIT

FEDERALLY-SPONSORED RESEARCH AND DEVELOPMENT

This invention is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil. Reference Navy Case Number 99200.

BACKGROUND OF THE INVENTION

This electroactive polymer-based artificial neuromuscular unit relates generally to the field of structures comprising a plurality of electroactive polymer (EAP) elements. Electrical energy is customarily distributed to individual polymer strands of a given EAP element by electrical conductors. While masses of polymer strands have been bundled together and activated in concert, no adequate method has existed for the coordination and individual control of sequences of polymer strands in structures comprising multiple EAP elements. An example of a structure with multiple EAP elements is the braided structure of U.S. Pat. No. 7,193,350 B1.

SUMMARY

The electroactive polymer-based artificial neuromuscular unit, as disclosed herein, comprises: an electroactive polymer (EAP) actuator layer; an EAP logic layer coupled to the actuator layer; an EAP energy layer coupled to the logic layer such that the logic layer is interposed between the energy layer and the actuator layer, wherein the logic layer is configured to control energy transfer between the energy layer and the actuator layer; and a sensor element operatively coupled to the actuator layer and the logic layer, wherein the sensor element is configured to communicate deflections of the actuator layer to the logic layer.

BRIEF DESCRIPTION OF THE DRAWINGS

Throughout the several views, like elements are referenced using like references. The elements in the figures are not drawn to scale as some dimensions are exaggerated for clarity.

DETAILED DESCRIPTION OF EMBODIMENTS

Figure 1A:
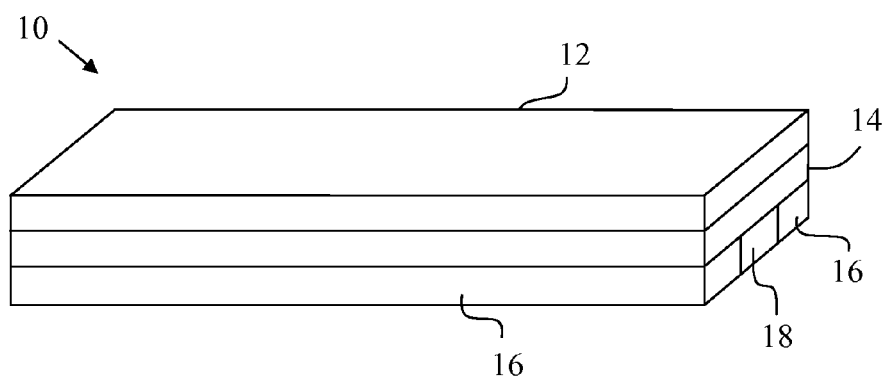
FIG. 1A is a perspective view of an artificial neuromuscular unit.

Electroactive polymers (EAPs) can be configured to function as conductors, batteries, sensors, actuators, and logic elements. An artificial neuromuscular unit (ANMU) may be produced by integrating several EAP elements with different functionality. FIG. 1A shows a perspective view of an ANMU 10 comprising an actuator layer 12, a logic layer 14, an energy layer 16, and a sensor element 18. The actuator layer 12 may be any EAP element capable of deflection when activated. Each ANMU 10 may be any desired size or shape. The logic layer 14 is a uniquely addressable EAP element that is coupled to the actuator layer 12. The energy layer 16 is an EAP element that is coupled to the logic layer 14 such that the logic layer 14 is interposed between the energy layer 16 and the actuator layer 12. The logic layer 14 is configured to gate energy from the energy layer 16 to the actuator layer 12. In other words, the logic layer 14 is configured to control the transfer of energy between the energy layer 16 and the actuator layer 12.

Figure 1B:
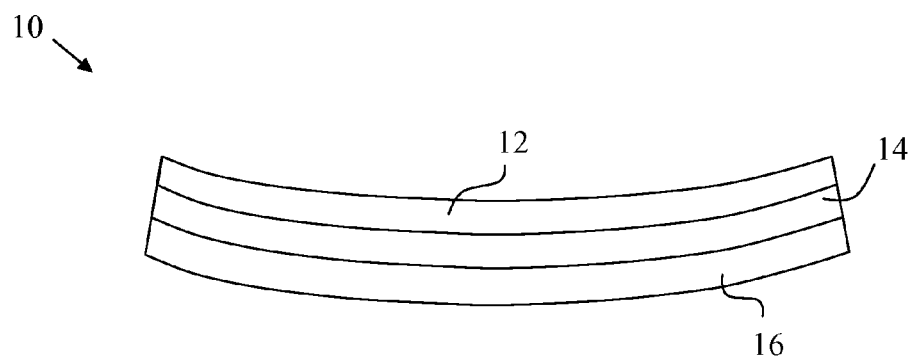
FIG. 1B is a side view of a deflected artificial neuromuscular unit.

The actuator layer 12 is the artificial muscle of the ANMU 10 and causes all of the ANMU 10 layers to deflect together with its activation. The type of deflection is a bending or curling of the polymer on the dimension orthogonal to the longitudinal axis of the actuator layer 12, as shown in FIG. 1B. Passive bending of the ANMU 10 by external forces also deflects all layers. Some types of polymers, when used as activators, also generate electrical currents with passive deflection. The actuator layer 12 may be made from, but is not limited to, the following materials: polypyrrole, polyaniline, and/or an ionic polymer metal composite (IPMC). Other examples of electroactive polymer actuators may be found in the following references: J. Madden, N. Vandesteeg, P. A. Anquetil, P. G. Madden, A. Takshi, R. R. Pytel, S. R. Lafontaine, P. A. Wieringa, and I. W. Hunter, *Artificial Muscle Technology: Physical Principles and Naval Prospects, IEEE Journal of Oceanic Engineering*, July 2004; Y. Bar-Cohen (editor), *Electroactive Polymer (EAP) Actuators as Artificial Muscles, Reality, Potential, and Challenges*, Second Edition, S.P.I.E, March 2004; and G. G. Walace, G. M. Spinks, L. A. P. Maguire, P. R. Teasdale, *Conductive Electroactive Polymers*, $2^{nd}$ edition (2003), CRC Press LLC, 2000 N.W. Corporate Blvd., Boca Raton, Fla. 33431.

The EAP-based logic layer 14 governs the potentials applied to the actuator layer 12 thus controlling activation. In a non-limiting embodiment, the logic layer 14 may be composed of electroactive polymer-based semiconductors. In instances of electrical current generation due to passive deflection of the actuator layer 12, the logic layer 14 may be configured to direct the generated current into the energy layer 16 for conduction elsewhere or for storage as described more fully below. The logic layer 14 may be manufactured by contemporary inkjet printing processes, as known in the art, or their equivalents. The logic layer 14 may be configured to serve the role of a sensor-activated gate for the energy from the energy layer 16 to the actuator layer 12.

The EAP-based energy layer 16 is configured to provide energy to the ANMU 10. In one embodiment, the energy layer 16 may be configured to store energy, wherein the energy layer 16 serves as an energy reserve and buffer. Suitable, non-limiting examples of the energy layer 16 include a polymer-based battery and a polymer-based super capacitor. In operation, passive deflections of the actuator layer 12, from air or water currents for example, could generate energy, which would be conducted through the logic layer 14 to the energy layer 16. In addition, depending upon how long and under what conditions the user wants the ANMU 10 to operate, the energy layer 16 may be configured to store and also generate energy. In one embodiment, the energy layer 16 may have a polymer-based photo-cell component, not shown. The energy layer 16 is electrically coupled to the logic layer 14 such that the logic layer 14 controls the transfer of energy to and from the energy layer 16 and the actuator layer 12.

The sensor element 18 is configured to provide electrical signals to the logic layer 14 that are proportional to ANMU 10 deflection. Thus, the sensor element 18 is disposed to communicate deflections of the actuator layer 12 to the logic layer 14. In one embodiment, the sensor element 18 may be an EAP-based sensor. EAP-based sensors can measure both stress and strain, through the measurement of changes in voltage, capacitance, and resistance with applied forces, depending upon the type of polymer employed. The sensor element 18 is the trigger or initiator of active deflection of the ANMU 10. Through the logic layer 14, sensor input can regulate direction, rate, and magnitude of the activation. The sensor element 18 provides essential feedback to the logic layer 14. If the logic is simple and the required response uniform, then the sensor element 18 can simply turn the actuator layer 12 on and off.

Figure 2A:
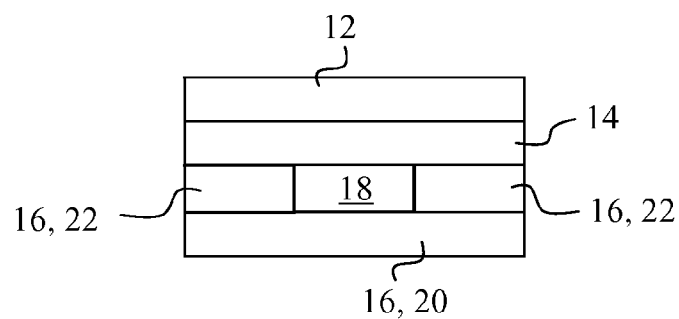
FIG. 2A is an end view of an embodiment of an artificial neuromuscular unit.
Figure 2B:
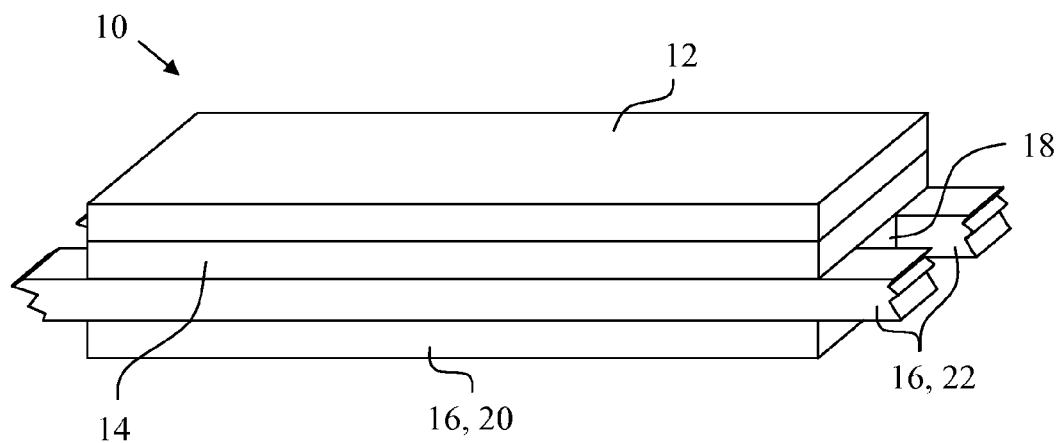
FIG. 2B is a perspective view of the artificial neuromuscular unit shown in FIG. 2A.

FIGS. 2A-2B show an embodiment of the ANMU 10, wherein the energy layer 16 comprises an energy storage component 20 and energy buses 22. The energy buses 22 in this embodiment are configured to communicate central control signals and power to and from the logic layer 14, a central controller external to the ANMU 10 and a central energy source external to the ANMU 10, shown in FIG. 4. The energy layer 16, like the logic layer 14, may be manufactured by contemporary inkjet printing processes, as know in the art, or their equivalents. All EAP layers of the ANMU 10, excepting the actuator layer 12, may be manufactured by inkjet printing processes and bonded to the actuator layer 12.

Figure 3:
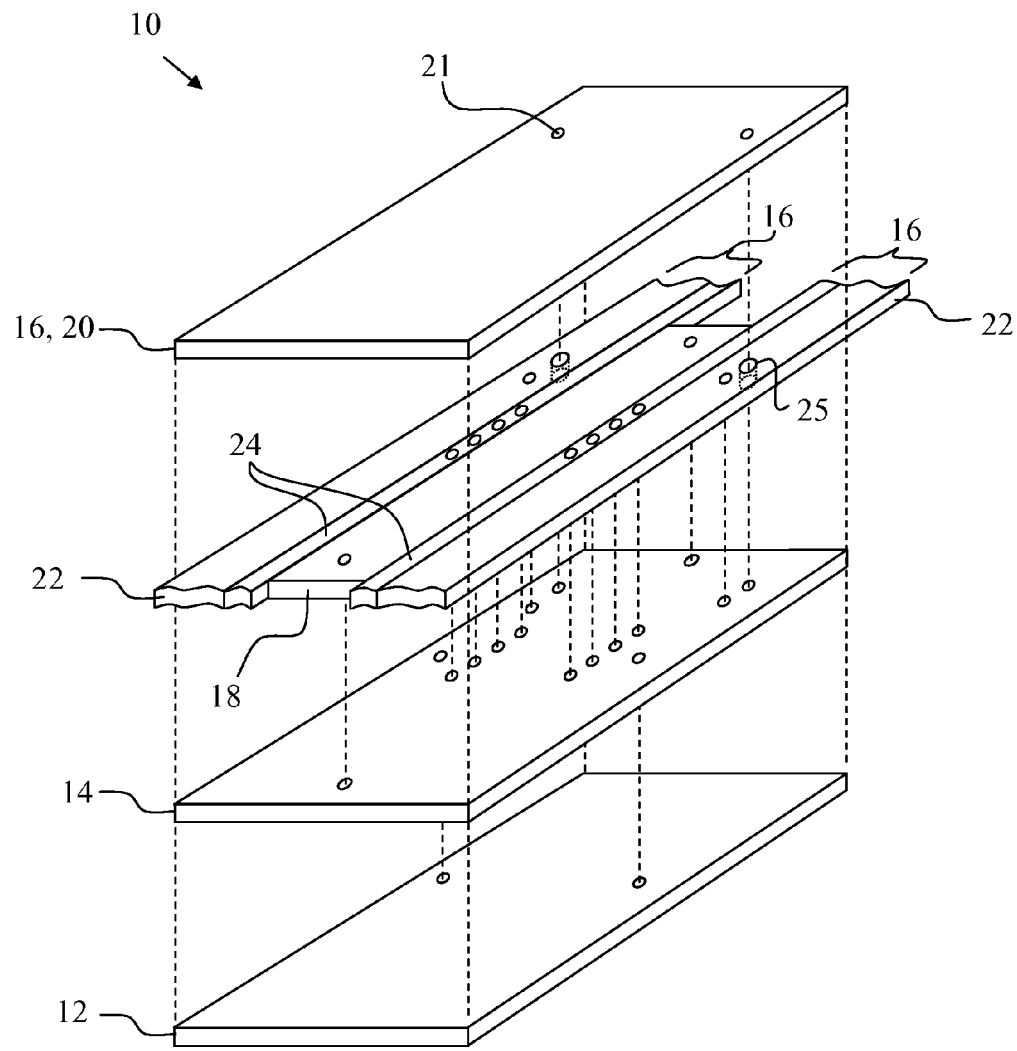
FIG. 3 is an expanded view of an embodiment of an artificial neuromuscular unit.

FIG. 3 is an expanded view of an example embodiment of the ANMU 10 showing some of the vertical connectivity between some of the layers. Terminal connection points 21 are represented in FIG. 3 as small circles. FIG. 3 also shows the energy layer 16 comprising an energy storage component 20, an energy bus 22 and an information bus 24. Conduction of electrical energy vertically through the ANMU 10 from and to the energy bus 22 of the energy layer 16 may be gated by the logic layer 14. The logic layer 14 may be configured to read its unique address from the information stream on the information bus 24 and respond to commands to activate its actuator layer 12. The logic layer 14 would accomplish activation by gating energy available on the energy bus 22 to the actuator layer 12, or by directing the stored energy in the energy storage component 20 to the actuator layer 12. The vertical connection of the logic layer 14 and the energy storage component 20 is shown in FIG. 3 as passing through the energy buses 22 by way of vias 25. The logic layer 14 may recharge the energy layer 16 by directing energy available from the energy bus 22 of the energy layer 16 to the energy storage component 20. The logic layer 14 may also be configured to sample the back voltages resulting from the deflections of the actuator layer 12 by external forces and direct that energy to the energy layer 16. The sensor element 18 responds to deflections of the ANMU 10 and communicates proportional signals to the logic layer 14 that may be used to assist regulation of the actuator element 12.

Figure 4:
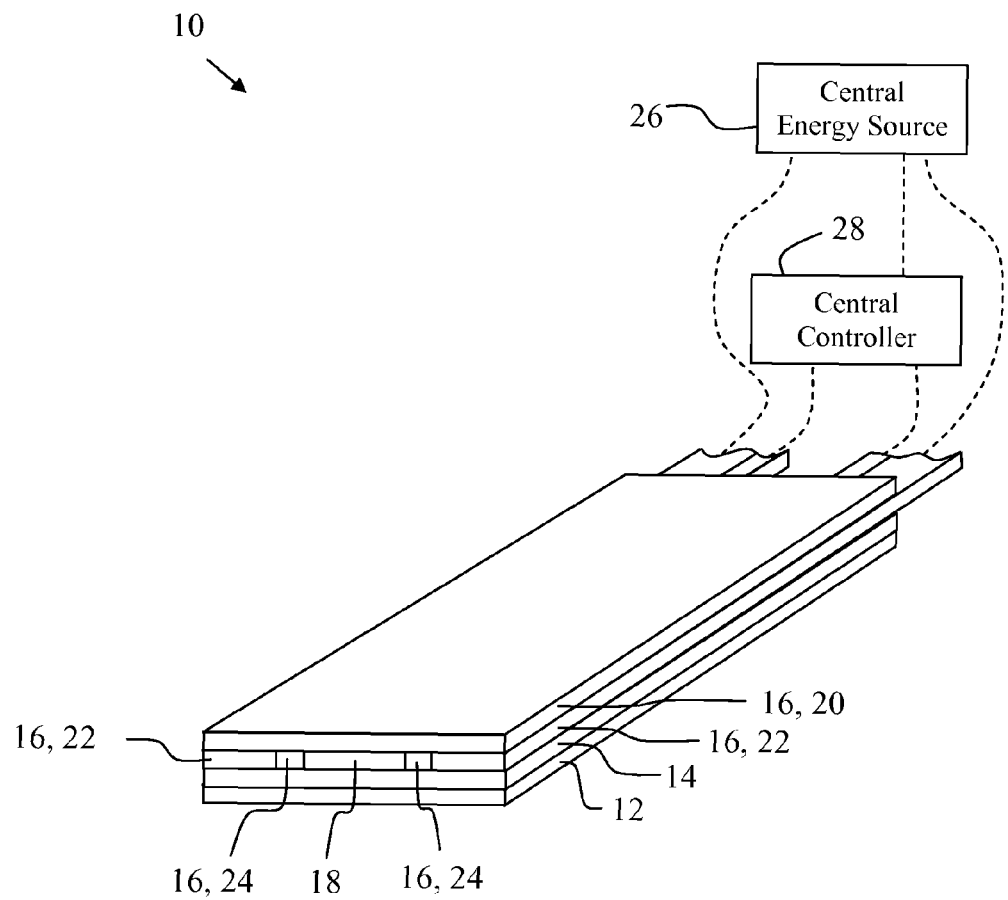
FIG. 4 is another perspective view of an artificial neuromuscular unit.

FIG. 4 is another perspective view of an example embodiment of the ANMU 10. In this embodiment, the energy bus 22 is electrically coupled to a central energy source 26 and the information bus 24 is coupled to a central controller 28. The central controller 28 may also be electrically coupled to the central energy source 26. It is to be understood that the ANMU 10 does not need to be coupled to the central energy source 26 or the central controller 28, but that such coupling is merely an alternative embodiment of the ANMU 10.

Figure 5:
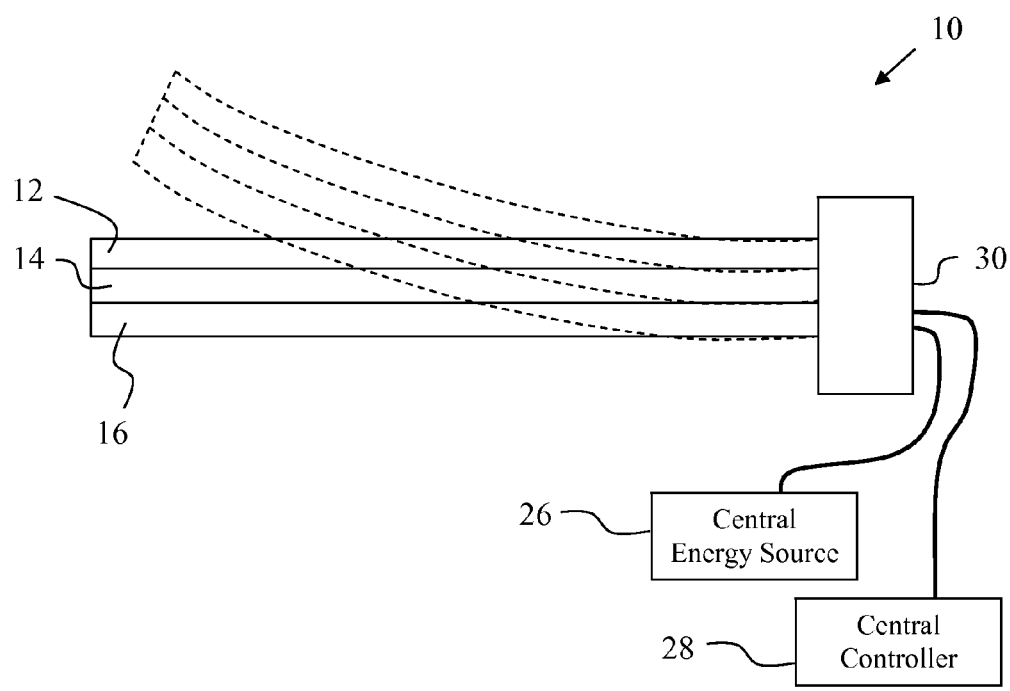
FIG. 5 is a side view of an artificial neuromuscular unit with one end coupled to an anchor.

FIG. 5 shows an embodiment of the ANMU 10 wherein one end of the ANMU 10 is mechanically coupled to an anchor 30. Either end of the ANMU 10 may be mechanically coupled to an anchor 30 or to a lever depending on the desired operation. However, it is to be understood that the ANMU 10 does not need to be attached to an anchor or a lever, but that the ANMU 10 may be freely active with both ends unattached to any other structure. FIG. 5 also shows the ANMU 10 in a rest position and in a deflected position. In this embodiment, the energy buses 22 may pass through the anchor 30 such that the energy bus 22 (not shown) and the information bus 24 (not shown) may be coupled to the central energy source 26 and the central controller 28 respectively.

Figure 6:
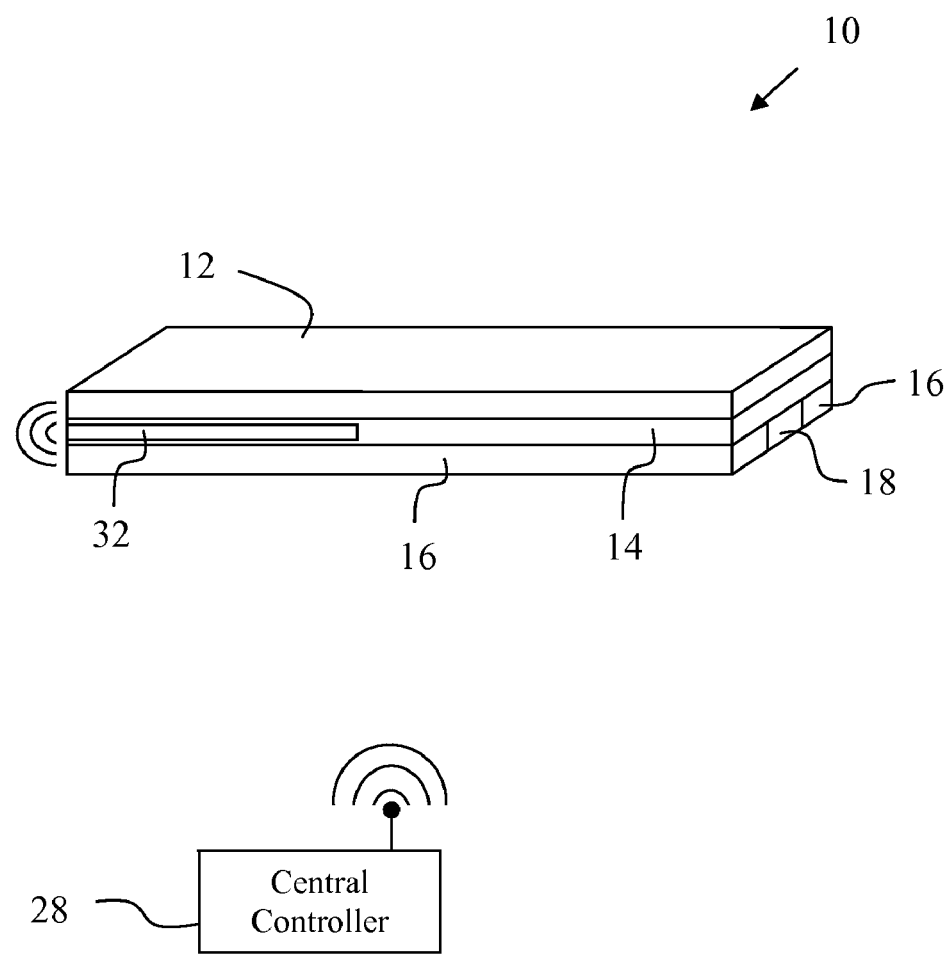
FIG. 6 shows an artificial neuromuscular unit in wireless communication with a central controller.

FIG. 6 shows an embodiment of the ANMU 10 wherein the logic layer 14 further comprises a radio frequency (RF) transceiver 32. The RF transceiver 32 functions may be implemented in the polymer-based logic layer 14 circuitry. As shown in FIG. 6, the presence of the RF transceiver 32 allows the logic layer 14 to communicate wirelessly with other RF-equipped logic elements. The central controller 28 is one example of an RF-equipped logic element. While a central controller 28 is depicted in FIG. 6, it is to be understood that other arrangements are also possible. For example, the individual ANMU 10 may be configured to wirelessly communicate with other similar ANMU 10 to form an ad hoc wireless network of nodes without a central controller 28.

From the above description of the ANMU 10, it is manifest that various techniques may be used for implementing the concepts without departing from the scope of the claims. The described embodiments are to be considered in all respects as illustrative and not restrictive. It should also be understood that the ANMU 10 is not limited to the particular embodiments described herein, but are capable of many embodiments without departing from the scope of the claims.

We claim:

1. An artificial neuromuscular unit (ANMU) comprising:
an electroactive polymer (EAP) actuator layer;
an EAP logic layer coupled to the actuator layer;
an EAP energy layer coupled to the logic layer such that the logic layer is interposed between the energy layer and the actuator layer, wherein the logic layer is configured to control energy transfer between the energy layer and the actuator layer;
a sensor element operatively coupled to the actuator layer and the logic layer, wherein the sensor element is configured to communicate deflections of the actuator layer to the logic layer;
wherein the energy layer comprises an energy storage component electrically coupled to the logic layer such that the logic layer is configured to gate energy to and from the energy storage component and the actuator layer; and
wherein the energy layer further comprises two energy buses and wherein the sensor element is laterally interposed between the two energy buses and vertically interposed between the logic layer and the energy storage component.

2. The ANMU of claim 1, wherein the energy layer further comprises an EAP-based photocell electrically coupled to the energy storage component.

3. The ANMU of claim 1, wherein the energy storage component is a polymer-based battery.

4. The ANMU of claim 1, wherein the energy storage component is a polymer-based super capacitor.

5. The ANMU of claim 1, wherein the logic layer further comprises a radio frequency (RF) transceiver.

6. The ANMU of claim 1, wherein the ANMU is encapsulated by a sheath filled with an electrolyte solution.

7. The ANMU of claim 1, wherein the energy layer further comprises an information bus operatively coupled to the logic layer.

8. The ANMU of claim 7, wherein the information bus is configured to be coupled to a central controller and wherein the logic layer is configured to communicate the state and dynamics of the ANMU via the information bus to the central controller.

9. The ANMU of claim 8, wherein the energy bus is configured to be coupled to a central energy source.

10. The ANMU of claim 9, wherein the central controller is configured to receive power from the central energy source.

11. The ANMU of claim 9, wherein the logic layer, the conductor layer, the energy storage layer, and the sensor element are manufactured by an inkjet printing process.

12. The ANMU of claim 10, wherein one end of the ANMU is mechanically coupled to an anchor.

13. The ANMU of claim 12, wherein one end of the ANMU is mechanically coupled to a lever.

14. An artificial neuromuscular unit (ANMU) comprising:
   an electroactive polymer (EAP) actuator layer;
   a uniquely addressable EAP-based logic layer coupled to the actuator layer;
   an EAP-based sensor element operatively coupled to the actuator layer and the logic layer, wherein the sensor element is configured to communicate deflections of the actuator layer to the logic layer;
   an EAP-based energy layer comprising an energy storage component electrically coupled to the logic layer such that the logic layer is configured to gate energy to and from the energy storage component and the actuator layer such that the logic layer is interposed between the energy layer and the actuator layer, wherein the energy layer further comprises two energy buses such that the sensor element is laterally interposed between the two energy buses and vertically interposed between the logic layer and the energy storage component; and
   wherein the actuator layer, the logic layer, the sensor element, and the energy layer are coupled together such that when the actuator layer is activated, all are configured to deflect together.

15. The ANMU of claim 14, wherein the logic layer further comprises an RF transceiver.

16. The ANMU of claim 15, wherein the energy layer further comprises an EAP-based photocell.

17. The ANMU of claim 16, wherein the logic layer is configured to conduct energy generated by passive deflection of the actuator layer to the energy layer.

18. The ANMU of claim 17, wherein the ANMU is encapsulated by a sheath filled with an electrolyte solution.

* * * * *